(12) United States Patent
Frenklakh

(10) Patent No.: US 7,901,957 B2
(45) Date of Patent: Mar. 8, 2011

(54) DISGUISING TEST PADS IN A SEMICONDUCTOR PACKAGE

(75) Inventor: Arie Frenklakh, Herzlia (IL)

(73) Assignee: SanDisk Corporation, Milpitas, CA (US)

( * ) Notice: Subject to any disclaimer, the term of this patent is extended or adjusted under 35 U.S.C. 154(b) by 126 days.

(21) Appl. No.: 11/958,059

(22) Filed: Dec. 17, 2007

(65) Prior Publication Data

US 2009/0152544 A1    Jun. 18, 2009

(51) Int. Cl.
*G01R 31/26* (2006.01)
*H01L 21/66* (2006.01)
*H01L 21/44* (2006.01)
(52) U.S. Cl. .......................................... 438/18; 438/612
(58) Field of Classification Search .................. 438/18, 438/612

See application file for complete search history.

(56) References Cited

U.S. PATENT DOCUMENTS

| 6,667,719 | B2 | 12/2003 | LaKomski |
| 7,220,915 | B1 | 5/2007 | Park et al. |
| 7,251,880 | B2 * | 8/2007 | Pearson et al. ................. 29/825 |
| 2006/0055539 | A1 | 3/2006 | Lawrence et al. |

FOREIGN PATENT DOCUMENTS

WO        2006004909 A2    1/2006

* cited by examiner

*Primary Examiner* — David A Zarneke
(74) *Attorney, Agent, or Firm* — Vierra Magen Marcus & DeNiro LLP

(57) ABSTRACT

A method of forming a semiconductor package is disclosed including disguising the test pads. Test pads are defined in the conductive pattern of the semiconductor package for allowing electrical test of the completed package. The test pads are formed in shapes such as letters or objects so that they are less recognizable as test pads.

17 Claims, 8 Drawing Sheets

DISGUISING TEST PADS IN A SEMICONDUCTOR PACKAGE

BACKGROUND OF THE INVENTION

1. Field of the Invention

Embodiments of the present invention relate to a semiconductor package and method of fabricating same.

2. Description of the Related Art

The strong growth in demand for portable consumer electronics is driving the need for high-capacity storage devices. Non-volatile semiconductor memory devices, such as flash memory storage cards, are becoming widely used to meet the ever-growing demands on digital information storage and exchange. Their portability, versatility and rugged design, along with their high reliability and large capacity, have made such memory devices ideal for use in a wide variety of electronic devices, including for example digital cameras, digital music players, video game consoles, PDAs and cellular telephones. Electrically Erasable Programmable Read Only Memory (EEPROM), including flash EEPROM, and Electrically Programmable Read Only Memory (EPROM) are among the most popular non-volatile semiconductor memories.

As with most storage devices, defects occur to some of the semiconductor memory components or storage areas during fabrication. For example, the individual storage elements or memory cells of a semiconductor memory array may be defective. Additionally, the peripheral circuitry for the memory array, including word lines, bit lines, decoders, etc., may be defective, rendering the associated storage elements defective as well.

Portions of a typical semiconductor memory fabrication process are shown in the prior art flowchart of FIG. 1. In step 20, wafer level testing is conducted prior to packaging the memory chips to form memory devices. A wafer can include hundreds or thousands of memory chips, each of which will include a memory array and peripheral components such as the control and logic circuits for accessing the memory cells of the array. During wafer level testing 20, the functionality of the memory chips is tested so that defective components are not needlessly integrated into a packaged device.

After wafer level testing 20, the wafer is divided into individual memory chips and one or more of the memory chips are mounted to a substrate, possibly along with a controller chip, and electrical connections are formed in step 22. In particular, the substrate may include a conductance pattern of photolithographically defined electrical traces. The controller and memory chips may be die bonded and electrically connected to the substrate to allow electrical communication between the controller chip and memory chips, as well as between the chip set and the outside world. After bonding and electrical connection in step 22, the die and substrate may be packaged in step 24 by encapsulating the die and substrate in a molding compound.

The packaged memory devices are then subjected to burn-in and electrical test processes in steps 26 and 28, respectively. Burn-in is performed to stress the memory arrays and peripheral circuitry of the chips. Burn-in is typically conducted at elevated temperatures (e.g., 125° C.) at which high voltages are applied at various portions of each chip to stress and identify weaker elements. Those die packages passing burn-in may undergo an electrical test in step 28. Referring to FIG. 2, during the burn-in and/or electrical test, electrical function of a package 30 may be tested using a memory test pad matrix 32 provided within the package.

The memory test pad matrix 32 includes a plurality of electrical test pads 34 exposed through the molding compound and electrically coupled to the memory die within the package. During burn-in and/or electrical test, the package may be inserted into a socket on a test card, whereupon the test pads are contacted by probes to test the electrical properties and functioning of the semiconductor package to determine whether the finished semiconductor package performs per specification. FIG. 2 also shows a plurality of contact fingers 36 for electrical connection of the package 30 with the outside world.

Referring now to prior art FIG. 3, assuming the package passes electrical inspection, the memory test pad matrix 32 may then be covered, as for example by a sticker or ink-jet printing 40. Although data stored within the flash memory of semiconductor packages is encrypted, market research has revealed that memory card users are concerned over access to internal memory through the test pads. In particular, users are concerned that the test pads are not appropriately concealed and that their stored content is not appropriately protected when they see a sticker covering what they know to be the test pads. It is known to address this concern by eliminating the test pads and testing the memory through an external interface. However, this approach is a much slower process and less efficient than testing via the test pads 34.

SUMMARY OF THE INVENTION

An embodiment of the present invention relates to a method of disguising test pads of a semiconductor package and a semiconductor package formed thereby. The semiconductor package includes a substrate having a conductive pattern. Test pads are defined in the conductive pattern for allowing electrical test of the completed semiconductor package. In accordance with embodiments of the invention, the test pads are formed in shapes such as letters or objects so that they are less recognizable as test pads. Where formed into letters, a single test pad may form an entire letter. Alternatively, a plurality of test pads together may form a single letter.

Alternative embodiments of the present invention relate to a method of disguising a cover for test pads of a semiconductor package, and a semiconductor package formed thereby. After the completed semiconductor package is tested via the test pads, the memory test pads may be covered with a cover. In accordance with this alternative embodiment, the cover may include a marking, such as text and/or an image. The purpose of the marking is to disguise the fact that the cover is provided to cover test pads. In particular, by providing a marking on the cover, users may believe that the cover is provided as a label, solely for the purpose of presenting the marking. Thus, if the disguise is effective, users would have no reason to believe that the package includes easily accessible test pads.

In an alternative embodiment, the test pads may be formed in a non-standard location and/or a non-standard configuration. By placing the test pads in a non-standard location and/or configuration, and then covering the test pads with a cover bearing a marking as described above, this further disguises the purpose of the cover.

DETAILED DESCRIPTION

Embodiments will now be described with reference to FIGS. 4 through 15, which relate to a semiconductor package including test pads and/or a sticker for covering test pads that is disguised so as to obscure the purpose of the test pads and/or test pad sticker. It is understood that the present invention may be embodied in many different forms and should not be construed as being limited to the embodiments set forth herein. Rather, these embodiments are provided so that this disclosure will be thorough and complete and will fully convey the invention to those skilled in the art. Indeed, the invention is intended to cover alternatives, modifications and equivalents of these embodiments, which are included within the scope and spirit of the invention as defined by the appended claims. Furthermore, in the following detailed description of the present invention, numerous specific details are set forth in order to provide a thorough understanding of the present invention. However, it will be clear to those of ordinary skill in the art that the present invention may be practiced without such specific details.

Figure 1:
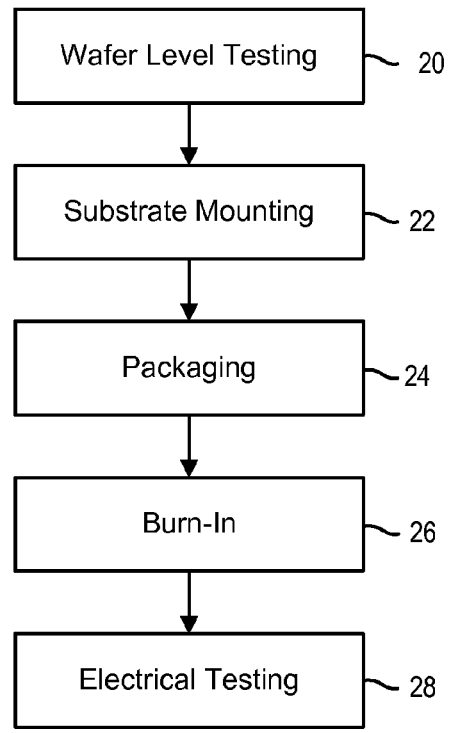
FIG. 1 is a prior art flowchart of a semiconductor fabrication process.
Figure 2:
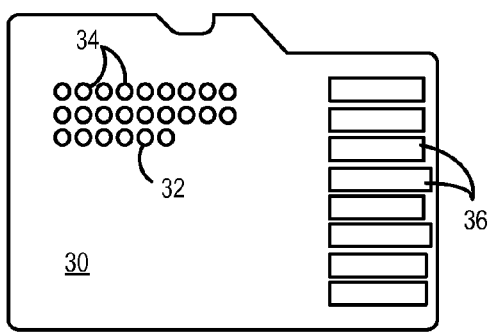
FIG. 2 is a bottom view of a prior art semiconductor package including test pads.
Figure 3:
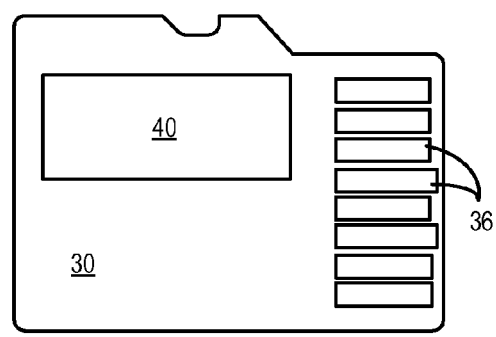
FIG. 3 is a bottom view of the prior art semiconductor package of FIG. 2, with the test pads covered with a conformal coating.
Figure 4:
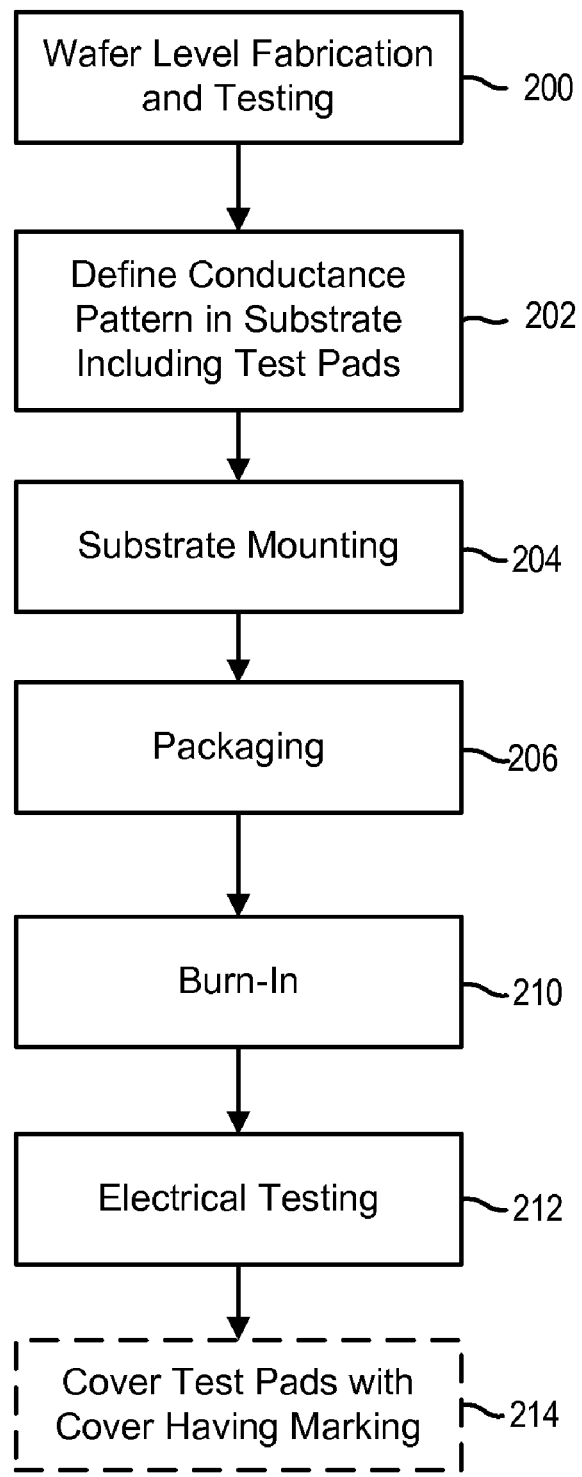
FIG. 4 is a flowchart of a process for fabricating a semiconductor package according to the present invention.
Figure 5:
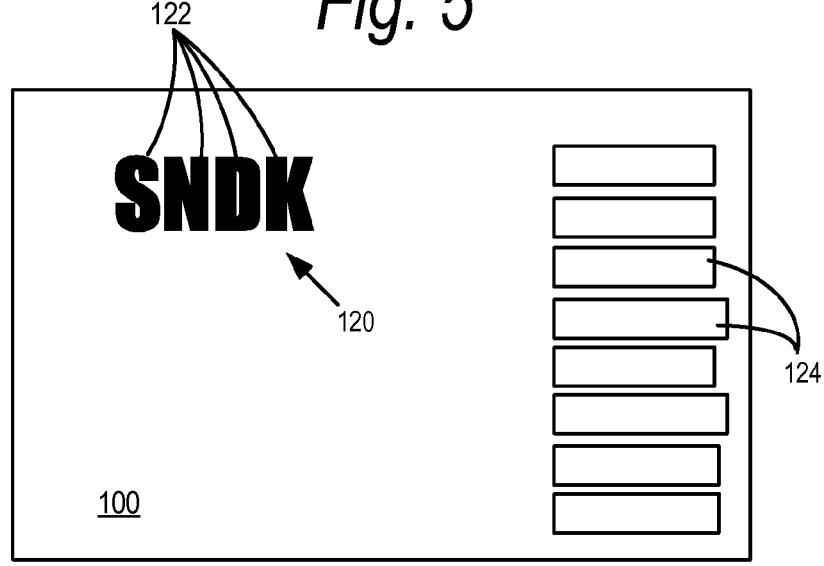
FIG. 5 is a bottom view of a semiconductor package for use in the present invention including disguised test pads.
Figure 6:
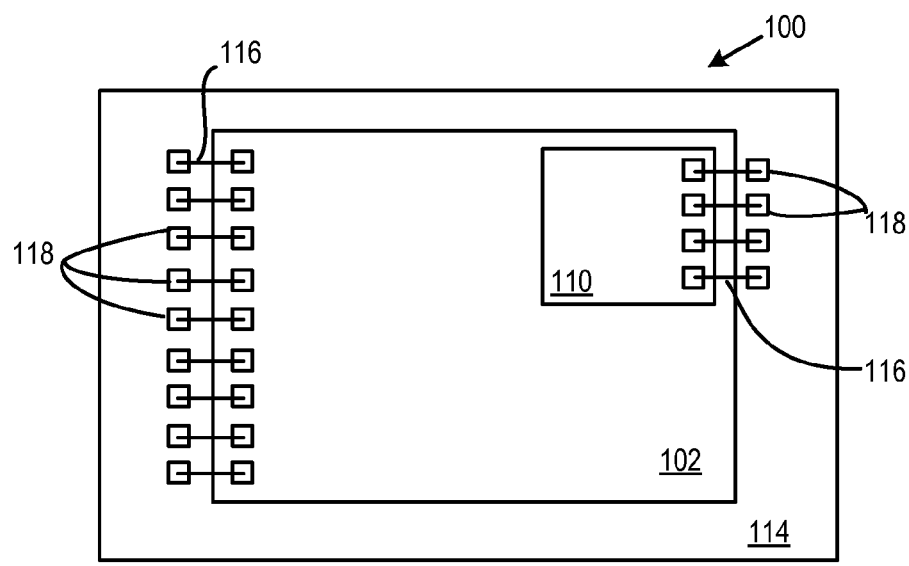
FIG. 6 is a top view of a semiconductor package during fabrication for use in the present invention.

FIG. 4 is a flowchart for fabricating a non-volatile memory package according to embodiments of the present invention, and FIGS. 5 and 6 illustrate bottom and top views, respectively, of a non-volatile memory package 100 according to embodiments of the present invention (FIG. 6 is shown prior to encapsulation). Semiconductor die may be fabricated and tested at the wafer level in step 200, and a conductance pattern may be defined on a substrate in step 202. The conductance pattern may include defined electrical traces formed on a surface of the substrate to carry signals to and from the die that get mounted on the substrate.

Moreover, as seen in FIG. 5, the conductance pattern on the bottom of the package 100 may include a test pad area 120 having test pads 122 according to the present invention. In embodiments, the test pads 122 may not look like a conventional test pad matrix, but rather may be formed into any of a variety of shapes including that of letters and/or images, with the purpose of disguising their nature as test pads. The test pads 122 shown in FIG. 5 are in the shape of letters, which may for example be all or a portion of a manufacturer, distributor or brand. However, the test pads 122 of FIG. 5 are by way of example only, and the test pads 122 may be any of a variety of other letters, images and shapes. Further details of the test pads 122 are explained in greater detail hereinafter. The bottom of the substrate may further include a plurality of contact fingers 124 capable of mating with pads within a host device to allow communication between the package 100 and the host device.

Referring now to step 204 and FIG. 6, the memory package 100 may include one or more memory die 102 and a controller die 110 mounted on a substrate 114. Where a plurality of memory die 102 are used, the memory die may be stacked and offset from each other along one or two axes. The memory die 102 may alternatively be stacked on top of each other without any offset. Where there is no offset, the memory die 102 may be separated by a spacer layer as is known in the art.

Each memory die 102 may include a non-volatile memory array formed of individual non-volatile memory cells. The memory array can include, but is not limited to, flash memory cells arranged using architectures such as the NAND and NOR architectures. The controller die 110 may for example be an ASIC and is included to control memory operations between a host device and the individual memory die 102. The controller die 110 is capable of independently addressing each memory die 102 of the system. It is not necessary that a controller be included in the memory system. For instance, some implementations may have the controller functionality handled by the host device, such as by a processor of a standard processor-based computing system.

Substrate 114 may be a variety of different chip carrier mediums, including a printed circuit board ("PCB"), a leadframe or a tape automated bonded (TAB) tape. Where substrate 114 is a PCB, the substrate may be formed of a core, having top and/or bottom conductive layers. The core may be formed of various dielectric materials such as for example, polyimide laminates, epoxy resins including FR4 and FR5, bismaleimide triazine (BT), and the like.

The conductive layers may be formed of copper or copper alloys, plated copper or plated copper alloys, Alloy 42 (42Fe/58Ni), copper plated steel, or other metals and materials known for use on substrates. The top and/or bottom layers may be etched with a conductance pattern for communicating signals between the controller die 110 and memory die 102, and the memory test pad matrix 120 and the memory die 102. The conductance pattern may be formed by a variety of processes including by photolithography.

Step 204 may also include a wire bonding operation where the memory die 102 and controller die 110 are wire bonded via wires 116 to the plated contact pads 118 of the conductance pattern in a known wire bond process. The wire bonding process electrically couples the memory die 102 and the controller die 110 to the substrate 114. The memory test pads 122 may also be coupled to the conductance pattern (or formed as part of the conductance pattern) to allow communication between the test pads 122 and the memory die 102.

As indicated, the test pads 122 are shaped to disguise their function as test pads. Instead, the test pads 122 are shaped as letters, images and/or other objects in order to disguise the purpose of the test pads. In a testing operation described hereinafter, the package 100 may be inserted into a socket on a test card (not shown), which includes a pattern of electrical contacts shaped to at least partially mate with the pattern of test pads 122. Upon insertion of the package 100 in the test card socket and mating of the test pads 122 with the electrical contacts, the test socket may test the electrical properties and functioning of the semiconductor package in a known manner to determine whether the finished semiconductor package performs per specification. While the testing is done in a conventional manner, the test pads and electrical contacts on the package and test socket, respectively, are arranged in a novel configuration.

In the example of FIG. 5, the test pads 122 may be a company name, such as for example the manufacturer or distributor of the package 100. The test pads 122 may alternatively be a brand name of the package, or some instruction or message. It is understood however, that, where test pads form letters, the letters may be any letters or text, and may be in any style. While four letters are shown, there may be more or less than four letters in alternative embodiments.

Figure 7:
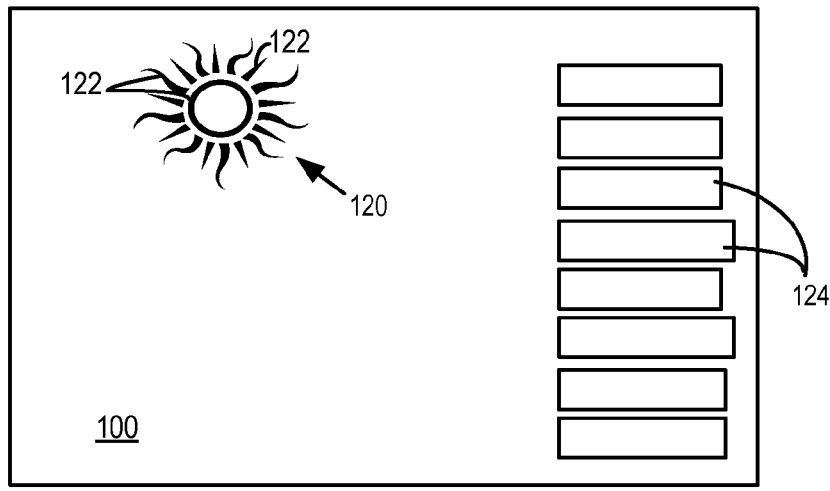
FIG. 7 is a view of a semiconductor package including disguised test pads according to a first alternative embodiment.

The test pads 122 in test pad area 120 may alternatively be formed into an image, such as for example as shown in FIG. 7. Where an image, the test pads 122 may be any image, object, logo, brand or artwork. The image may alternatively or additionally be a pattern. There may be multiple images as well. As with the letters, where the test pads 122 form an image, the test socket may have a pattern of like electrical contacts shaped to mate with some or all of the respective test pads 122 in the image.

Figure 8:
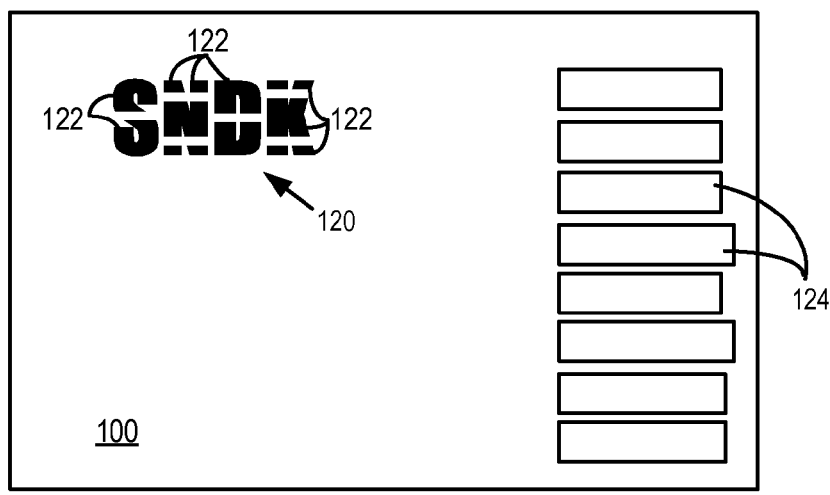
FIG. 8 is a view of a semiconductor package including disguised test pads according to a second alternative embodiment.
Figure 9:
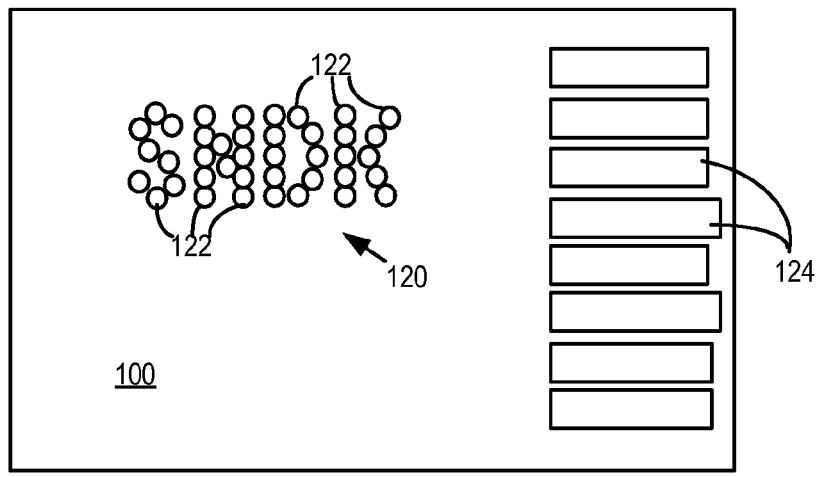
FIG. 9 is a view of a semiconductor package including disguised test pads according to a third alternative embodiment.
Figure 10:
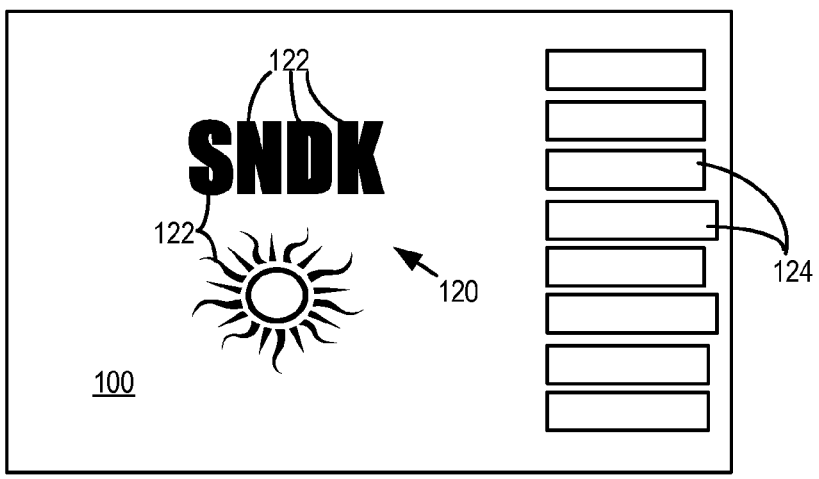
FIG. 10 is a view of a semiconductor package including disguised test pads according to a fourth alternative embodiment.

In the example of FIG. 5, each letter forms a single contact. For example, in the first letter, the top portion of the "S" is electrically coupled to the bottom portion of the "S." However, for example as shown in FIG. 8, a single letter may be broken into several different test pads 122. In FIG. 8, each test pad 122 is an irregular shape which, when taken together, form letters and/or text. In FIG. 9, each test pad 122 may have a conventional shape (such as for example round), but may be arranged to form any of the letters, text, objects or patterns described above. It is further understood that the test pads 122 may include a combination of text and image(s), as shown for example in FIG. 10. The specific text and specific image shown in FIGS. 5 and 7-10 are by way of example only and may be any of a variety of other letters, images and patterns in further embodiments.

In step 206, the package 100 may be encapsulated in a molding compound. Although not critical to the present invention, the molding compound may be an epoxy such as for example available from Sumito Corp. or Nitto Denko Corp., both having headquarters in Japan. Other molding compounds from other manufacturers are contemplated. The molding compound may be applied according to various processes, including by transfer molding or injection molding techniques. The molding compound covers the controller and memory die. Molding compound may or may not be applied to the bottom of the package. However, even where it is applied on the bottom of the package 100, the memory test pads 122 and contact fingers 124 are left visible and exposed.

Referring now to step 210, after packaging, burn-in may be performed to stress the memory arrays and peripheral circuitry of the chips. Burn-in may be conducted at approximately 125° C. with high voltages applied at various pins of each memory die 102 to stress and identify weaker die. After burn-in, electrical testing may be performed in step 212. Numerous types of package-level electrical tests can be applied, including by way of example, bit and word line tests to detect faults, shorts, etc.; memory cell tests for reading, writing, and data retention; peripheral circuitry tests, etc. It is understood that the burn-in or electrical test may be omitted, and that further alternative tests may be performed using the memory test pad matrix 120. As indicated above, testing may be performed by inserting the package into a test socket having a pattern of electrical contacts that mate with the pattern of test pads 122.

Figure 11:
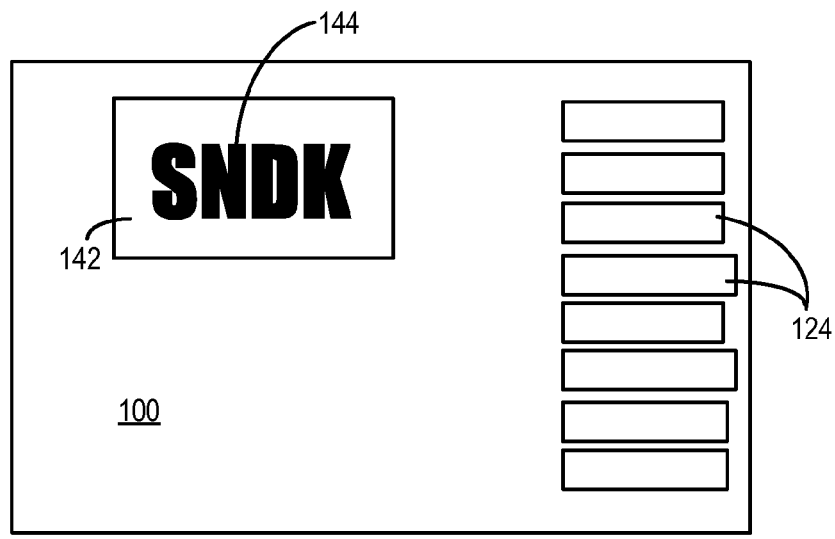
FIG. 11 is a view of a semiconductor package having test pads covered by a cover according to an embodiment of the present invention.

In embodiments, the test pads 122 may be left exposed. However, optionally, after the electrical testing of the package 100 is completed, the memory test pad area 120 may be covered with a cover 142 in step 214 as shown in FIG. 11. The cover 142 may be any of a variety of conformal coatings, including for example an adhesive sticker or a layer applied by ink-jet printing or other process. Further details regarding conformal coatings for covering test pads are set forth in U.S. patent application Ser. No. 11/551,402 entitled, "Method for Producing Portable Memory Devices," currently pending, which application is assigned to the owner of the present invention and which application is incorporated by reference herein in its entirety.

Figure 12:
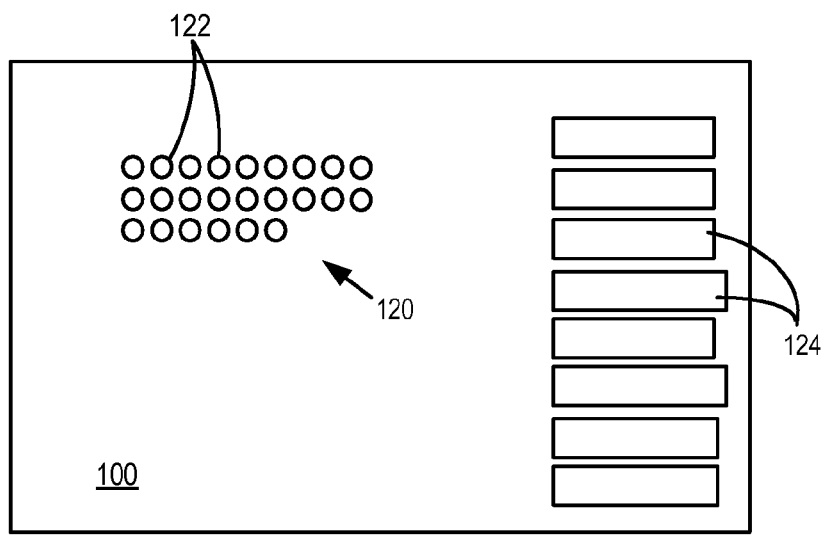
FIG. 12 is a view of a semiconductor package including test pads to be covered with a cover for disguising the existence of the test pads.
Figure 13:
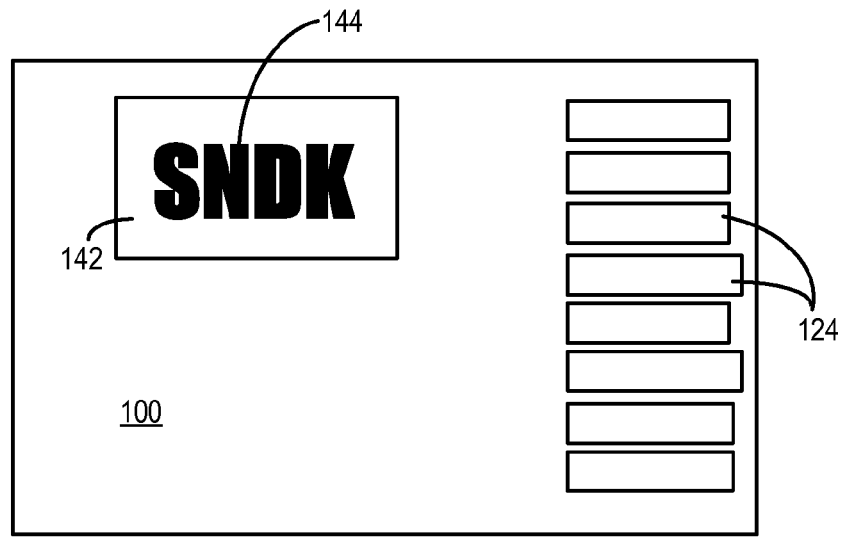
FIG. 13 is a view of a semiconductor package including a cover for disguising the existence of the test pads.

In embodiments having a cover 142, the cover may have a marking 144 matching that of the test pads 122 covered by the cover 142. However, in embodiments including a cover 142, test pads 122 may be provided in conventional configuration, such as shown in FIG. 12. Thereafter, the test pads may be disguised by applying a cover 142 having a marking 144. The marking may be text as shown in FIGS. 11 and 13. For example, the marking 144 may be a company name, such as for example the manufacturer or distributor of the package 100. The marking 144 may alternatively be a brand name of the package, or some instruction or message. It is understood however, that, where marking 144 is text, the text may be any text and may be in any style.

Figure 14:
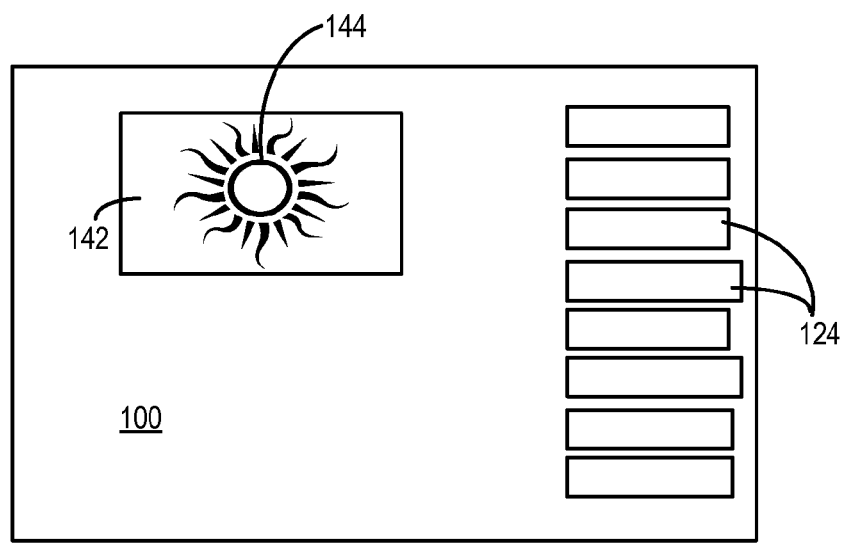
FIG. 14 is a view of a semiconductor package including a first alternative cover for disguising the existence of the test pads.
Figure 15:
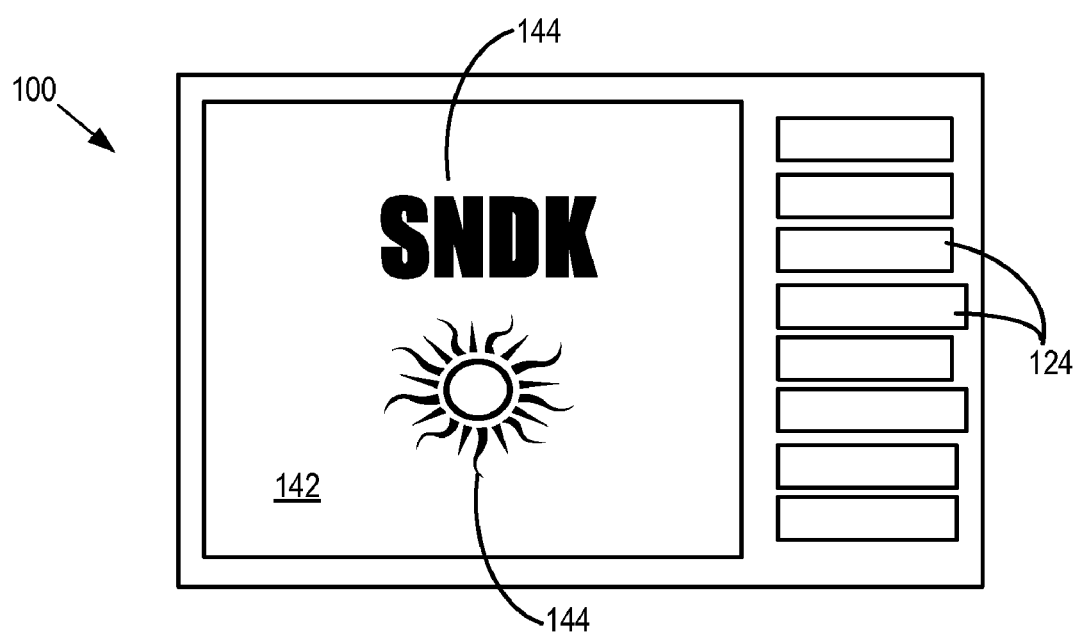
FIG. 15 is a view of a semiconductor package including a second alternative cover for disguising the existence of the test pads.

The marking 144 may alternatively be an image as shown in FIG. 14. For example, the marking 144 may be a corporate logo, product brand or artwork. It is understood that where marking 144 is an image, the image may be any image or pattern, in any style. There may be multiple images as well. It is further understood that the marking 144 may include a combination of text and image, as shown for example in FIG. 15. The specific text and specific image shown in FIGS. 13-15 are by way of example only. The cover 142 may cover only the area of the test pads (FIGS. 13 and 14), or the cover 142 may cover more, or all, of the bottom surface of the package 100, while leaving contact fingers 124 exposed (FIG. 15).

The purpose of the marking 144 in the embodiments of FIGS. 13-15 is to disguise the fact that the cover 142 is provided to cover test pads. As explained in the Background section, it is known to conceal test pads beneath a cover. However, in conventional packages, there is no attempt made to disguise the fact that the cover is provided to conceal test pads. Thus, in conventional packages, attempt may be made to remove the cover to gain access to the test pads. In accordance with this embodiment of the present invention, the marking is provided to disguise that the cover is covering test pads. In particular, by providing a marking 144 on the cover 142, users may believe that the cover is provided as a label, solely for the purpose of presenting the marking. Thus, if the disguise is effective, users would have no reason to believe that the package 100 includes easily accessible test pads.

While the figures show a Micro SD memory card footprint, it will be understood that the present invention may be used on any of a wide variety of memory packages that include test pads, including for example CompactFlash, SmartMedia, MMCc card, SD card, miniSD card and xD card. Moreover, while the test pads 122 are shown on the bottom surface of the package 100, it is understood that the test pads 122 and the cover 142 may be positioned on the top surface of the package 100, on a side of the package opposite the contact fingers 124.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

I claim:

1. A method of fabricating a semiconductor package, the method comprising the steps of:
   (a) forming test pads on a surface of the semiconductor package, said step (a) of forming the test pads comprising the step of disguising a purpose of the test pads by forming the test pads into a shape that reduces a likelihood that the test pads are recognizable as test pads; and
   (b) testing the functioning of the semiconductor package via the test pads formed in said step (a).

2. A method of fabricating a semiconductor package as recited in claim 1, said step (a) of forming the test pads comprising the step of forming a plurality of test pads into the shape of one or more letters.

3. A method of fabricating a semiconductor package as recited in claim 2, said step of forming a plurality of test pads into the shape of one or more letters comprising the step of forming the test pads into the shape of one of a company name or brand.

4. A method of fabricating a semiconductor package as recited in claim 1, said step (a) of forming the test pads comprising the step of forming a single test pad in the shape of a letter.

5. A method of fabricating a semiconductor package as recited in claim 1, said step (a) of forming the test pads comprising the step of forming a plurality of test pads into the shape of a single letter.

6. A method of fabricating a semiconductor package as recited in claim 1, further comprising the step (c) of covering the test pads.

7. A method of fabricating a semiconductor package as recited in claim 6, said step (c) of covering the test pads comprising the step of covering the test pads with a cover having a marking matching the one or more letters and/or objects.

8. A method of fabricating a semiconductor package as recited in claim 1, said step (a) comprising the step of:
   forming the test pads into the shape of one or more letters and/or objects.

9. A method of fabricating a semiconductor package as recited in claim 8, said step (a) of forming the test pads comprising the step of forming a single test pad in the shape of a letter.

10. A method of fabricating a semiconductor package as recited in claim 8, said step (a) of forming the test pads comprising the step of forming a plurality of test pads into the shape of a single letter.

11. A method of fabricating a semiconductor package as recited in claim 8, said step (a) of forming the test pads comprising the step of forming a plurality of test pads into the shape of one or more letters and one or more objects.

12. A method of fabricating a semiconductor package as recited in claim 8, said step (a) of forming the test pads comprising the step of forming a plurality of test pads into the shape of one or more letters.

13. A method of fabricating a semiconductor package as recited in claim 12, said step of forming a plurality of test pads into the shape of one or more letters comprising the step of forming the test pads into the shape of one of a company name or brand.

14. A method of fabricating a semiconductor package, the method comprising the steps of:
   (c) forming a first electrically conductive pad on a substrate of the semiconductor package in the shape of at least a portion of a first letter;
   (d) forming at least a second electrically conductive pad on a substrate, adjacent the first electrically conductive pad, in the shape of at least a portion of a second letter; and
   (e) testing the functioning of the semiconductor package via the first and at least second electrically conductive pads formed in said steps (a) and (b).

15. A method of fabricating a semiconductor package as recited in claim 14, said step (b) of forming at least a second electrically conductive pad on the substrate comprising the step of forming a single test pad in the shape of the second letter.

16. A method of fabricating a semiconductor package as recited in claim 14, said step (b) of forming at least a second electrically conductive pad on the substrate comprising the step of forming a plurality of test pads which together form the shape of the second letter.

17. A method of fabricating a semiconductor package as recited in claim 12, said steps of forming electrically conductive pads on a substrate comprising the step of forming the electrically conductive pads into the shape of one of a company name or brand.

* * * * *